(12) United States Patent
Piccardi et al.

(10) Patent No.: US 10,539,973 B1
(45) Date of Patent: Jan. 21, 2020

(54) LOW-VOLTAGE BIAS GENERATOR BASED ON HIGH-VOLTAGE SUPPLY

(71) Applicant: Micron Technology, Inc., Boise, ID (US)

(72) Inventors: Michele Piccardi, Cupertino, CA (US); Xiaojiang Guo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/221,987

(22) Filed: Dec. 17, 2018

(51) Int. Cl.
*G11C 5/14* (2006.01)
*G05F 3/20* (2006.01)
*H02M 3/07* (2006.01)
*G05F 3/24* (2006.01)

(52) U.S. Cl.
CPC .............. *G05F 3/205* (2013.01); *G05F 3/24* (2013.01); *G11C 5/146* (2013.01); *H02M 3/07* (2013.01)

(58) Field of Classification Search
CPC ........... G05F 3/205; G05F 3/24; G11C 5/146; G11C 5/147; H02M 3/07
USPC ................. 327/535–538, 540–543; 365/226
See application file for complete search history.

(56) References Cited

U.S. PATENT DOCUMENTS

| | | | | |
|---|---|---|---|---|
| 7,072,238 B2* | 7/2006 | Chae | ...................... | G11C 5/145 365/185.21 |
| 7,358,794 B2* | 4/2008 | Kawagoshi | ........... | H02M 3/073 327/537 |
| 8,729,874 B2* | 5/2014 | Ochoa | ................ | G06K 19/0709 323/271 |
| 9,722,489 B1* | 8/2017 | Guo | ....................... | G11C 5/145 |
| 9,798,346 B2* | 10/2017 | Utsunomiya | ........... | G05F 3/262 |
| 2009/0273391 A1* | 11/2009 | Tseng | .................... | G11C 16/30 327/536 |
| 2013/0321068 A1* | 12/2013 | Castagna | ................ | G05F 1/468 327/536 |

* cited by examiner

*Primary Examiner* — Tomi Skibinski
(74) *Attorney, Agent, or Firm* — Schwegman Lundberg & Woessner, P.A.

(57) ABSTRACT

Apparatus and methods are disclosed for providing a bias. A main diode has first and second terminals that connect to a high voltage (HV) line and to an HV regulated line, respectively. The main diode provides a voltage on the HV regulated line lower than a voltage of the HV line. A first current mirror provides a first current. The current mirror connects to the first terminal of the main diode and the HV regulated line. A second current mirror provides a second current. The second current mirror connects to the HV line, the first current mirror, and a low-voltage (LV) line. An impedance is between the LV line and the HV regulated line. A voltage differential between the HV regulated line and the LV line below a low-voltage threshold, and a voltage differential between the HV regulated line and the HV line above the low-voltage threshold are provided.

20 Claims, 9 Drawing Sheets

LOW-VOLTAGE BIAS GENERATOR BASED ON HIGH-VOLTAGE SUPPLY

BACKGROUND

Memory devices commonly use high-voltage (HV) devices within a source gate to connect a bit line and source line in a NAND string to allow operations to be performed on the NAND string (pillar or array). For example, the source gate may connect the bit line and the source line to erase the NAND string. Some memory devices require relatively high voltages for specific memory operations. For example, flash memory devices can require voltages greater than 12 volts (e.g., up to 30 volts or more) for specific memory operations, such program or erasure of memory cells. Some operations, such as an erase operation, require a high voltage to be applied to the source line and the bit line to bias the selected NAND string. In an erase operation, gate-induced drain leakage can be used to deplete the NAND cells of charge by quantum tunneling causing the cell to be erased. To handle the high voltage, HV devices can be used.

Both low-voltage (LV) and high-voltage devices (e.g., transistors, other semiconductor components, etc.) typically include one or more dielectric layers, such as a silicon dioxide layer or one or more other dielectric or oxide layers. Devices are commonly rated for a limited voltage that may be safely applied across the dielectric layer, with estimated time-to-failure increasing exponentially with the voltage applied across the dielectric layer. Accordingly, the voltage applied across the dielectric layer should be managed to avoid damaging the device and to ensure industry standard reliability specifications.

Low-voltage devices are rated for relatively small voltages. Existing low-voltage devices commonly have voltage thresholds of 4 volts or less. In certain examples, the term "low voltage" is relative to voltage thresholds of similar, higher-voltage devices. Existing high-voltage devices commonly have voltage thresholds substantially greater than 4 volts, such as 30 volts or more. As technology advances, such terms will evolve.

Dielectric layers (e.g., a silicon dioxide layer) in a low-voltage device are thinner than corresponding layers in a similar, high-voltage device. The relatively thinner dielectric layer of low-voltage devices has a smaller voltage threshold that may be safely applied across the dielectric layer. Voltages above this threshold applied across the dielectric layer may damage such layers or devices and may decrease the time-to-failure for the device. Accordingly, for safe operation, voltages across the dielectric layer should be less than the threshold for low-voltage devices.

High-voltage devices have thicker dielectric layers, in contrast to low-voltage devices, which allow high-voltage devices to operate with higher voltages applied across the dielectric layer. For example, high-voltage devices may safely operate at 30 volts. High-voltage devices tend to be larger, less conductive, and slower than low-voltage devices. Accordingly, low-voltage devices may be preferred for performance of analog, digital, and mixed signal applications. Low-voltage devices, however, are not typically used within high-voltage devices, such as charge pumps or high-voltage bias circuits, due to the strict control requirements of voltages over the dielectric layer of the low-voltage device to ensure safe operation. Using low-voltage devices for some components in analog and/or mixed signal applications, such as charge pumps or bias circuits, would provide performance and/or efficiency benefits in such applications.

In NAND design, circuits may be located below the NAND strings in what is commonly referred as CMOS Under Array (CuA). Analog, digital, and sensing/muxing of bit line circuitry can be located in this area. Decreasing the size of the sensing/muxing circuitry increases the area available for other circuitry. HV devices can be 5× to 10× larger in size compared to LV devices of similar transconductance. Accordingly, replacing HV devices with LV devices below the NAND strings can create additional area that can be used for additional circuitry. The high voltage needed for operations, however, presents various challenges to safely using LV devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, techniques, and methods to generate a low-voltage bias and a high-voltage bias using a high-voltage source. In an example, a bias generator may be used to provide low and high-voltage biases in certain memory devices, such as NAND memory devices. For example, the bias generator can bias low-voltage devices in a source gate that connects a bit line and a source line of a NAND string. Connecting the bit line and the source line allows a voltage to be applied across the NAND string to perform an operation, such as erasing the NAND string. In an example, the source gate includes a LV device. Accordingly, the voltage applied across the dielectric layer of the LV device needs to be less than the low-voltage threshold to avoid damaging the LV device. In the described memory devices (e.g., NAND memory device, etc.), a low voltage is used for operating a majority of logic in the devices. In current commercial technologies, low voltage in NAND memory devices will be 4 volts or less. For the purpose of the present description, "low voltage" will refer to a voltage of 4 volts or less, and "high voltage" will refer to a voltage of 8 volts or greater. "High voltage" does not refer to the highest voltage on the memory device, as multiple voltages above 8 volts may be utilized for various purposes. Similarly, a memory device may use multiple voltages lower than the logic operating voltage (e.g., 4 volts, etc.).

LV devices are much smaller compared to HV devices of similar transconductance. Given the high voltage needed for some operations on NAND strings, source gates have previously used HV devices. The present inventors have recognized that using LV devices, rather, than HV devices can provide additional area for circuitry. In addition, the present inventors have recognized that a LV device could be safely used in a source gate with some additional circuitry to ensure the voltage applied across the dielectric layer is below the low-voltage threshold. Further, the present inventors recognized that a LV source gate can be designed to pass additional current when needed, such as when a large capacitive load is desired.

Figure 1:
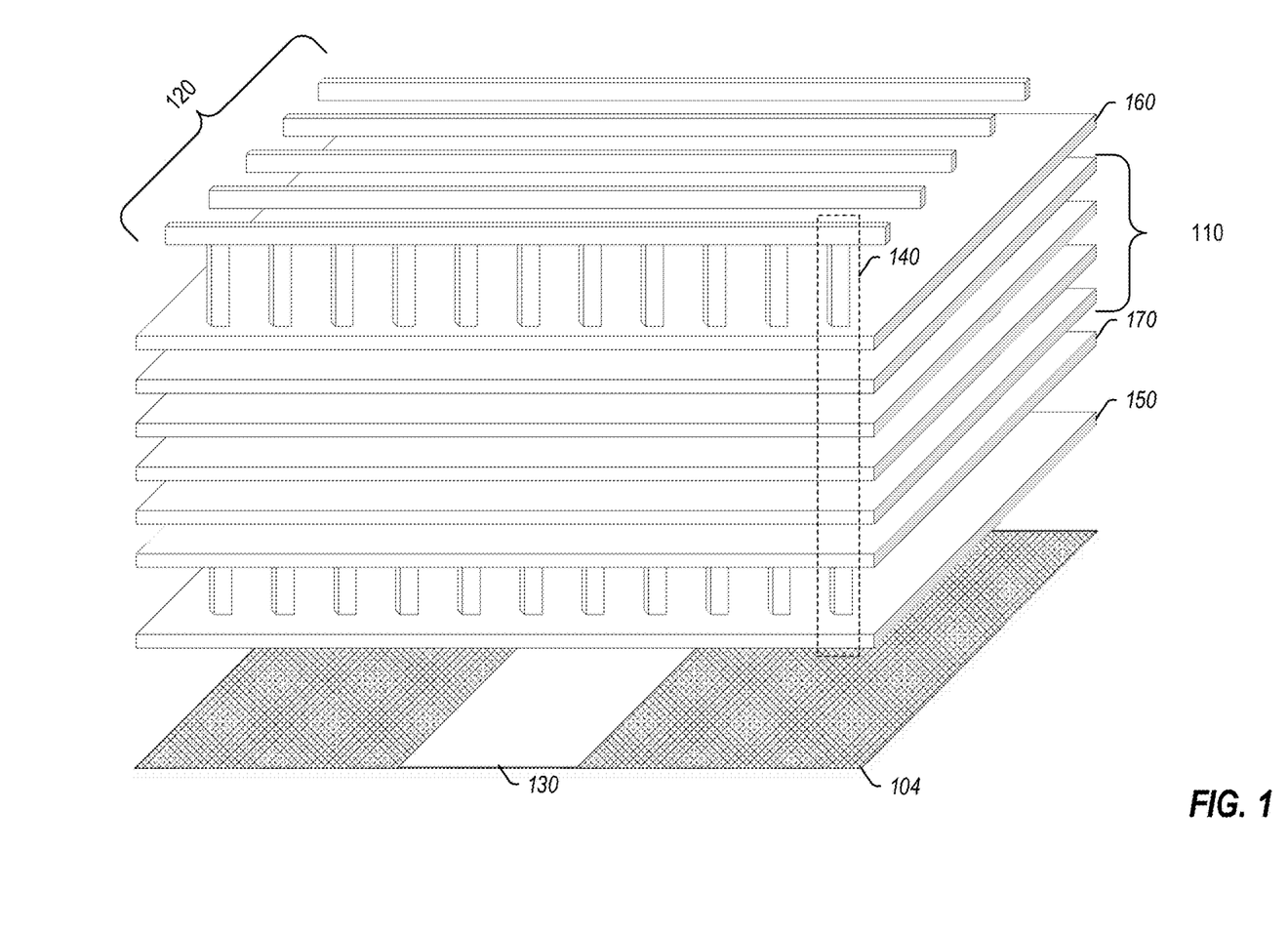
FIG. 1 illustrates an example a NAND array.

FIG. 1 illustrates an example a NAND array 100, specifically a 3D NAND array, where multiple select gates SGS 170, multiple word lines 110, multiple select gates SGD 160, multiple source lines 150, and multiple bit lines 120 are stacked vertically. An example implementation of the NAND array 100 is a complementary metal-oxide-semiconductor (CMOS) under array (CuA), where the NAND stack is built on top of a CuA plane 104. A string 140 may be selected for an operation by connecting a corresponding bit line and a corresponding word line. Once selected, a voltage may be applied to the string 140. The CuA plane 104 includes a circuit area 130 that may include analog, digital, and sensing/muxing of the bit line circuitry. The larger the circuit area 130, the more circuits may be placed under the NAND array 100 within the CuA plane.

Each NAND string can include a source gate that connects the bit line (e.g., one of the bit lines 120) and a source line 150. The source gate may be located in the area 130. In an example, the source gate uses a LV device rather than a HV device. Since LV devices are 5× to 10× smaller than HV devices for the same transconductance, the area dedicated to the bit line muxing may be smaller; thus, increasing free space within the area 130 for additional circuitry. The impact of using smaller LV devices is compounded based on the number of planes of NAND arrays, the number of blocks, and the page size. The number of devices can be in the order of $10^6$ devices. In an example, this corresponds to between 1-10 milimeter$^2$ of additional space added to the area 130 when using LV devices.

Figure 2:
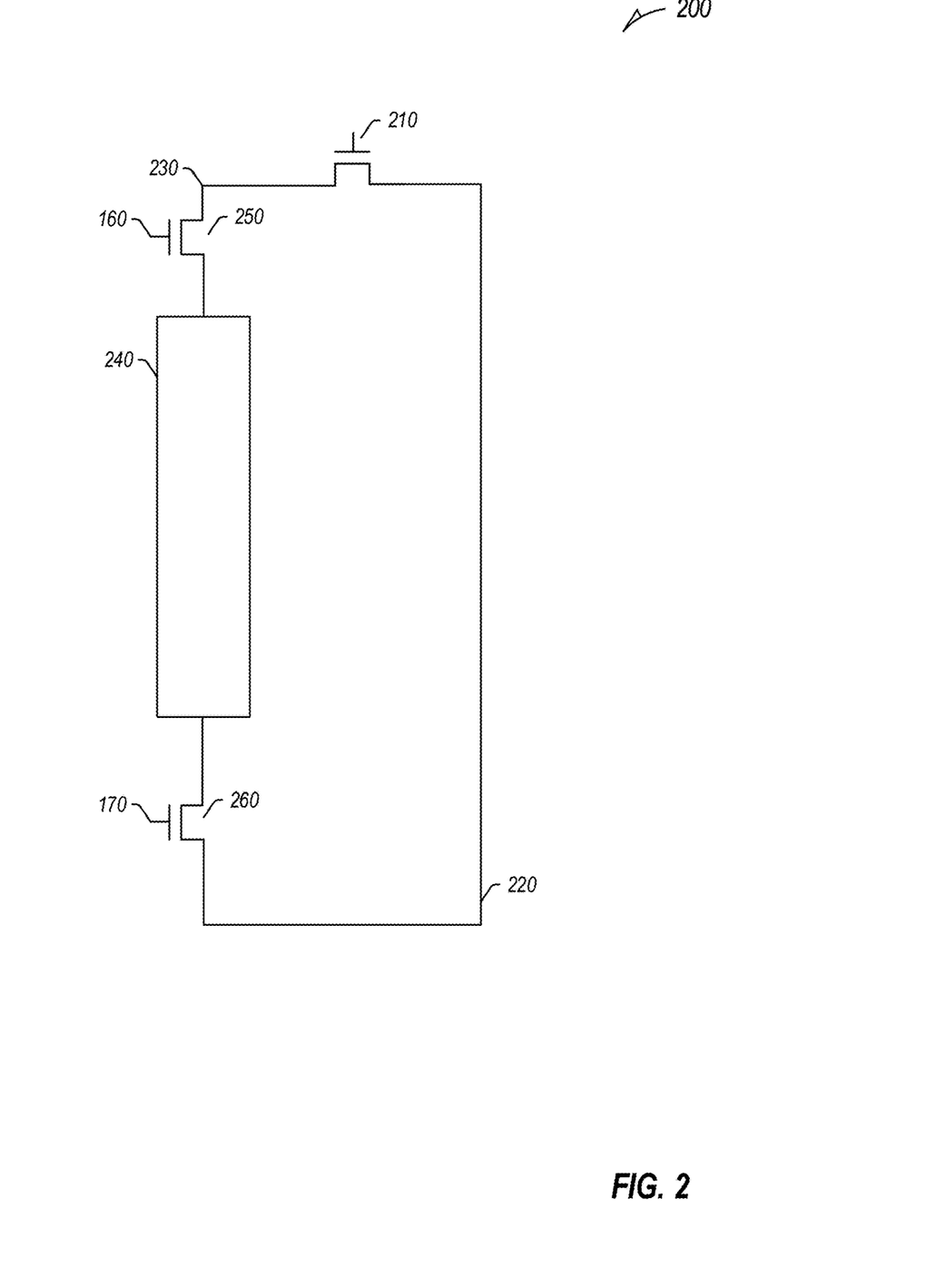
FIG. 2 illustrates an example cell that includes a low-voltage source gate used to connect a bit line and a source line.

FIG. 2 illustrates an example of a cell 200 that includes a low-voltage source gate 210 used to connect a bit line 230 and a source line 220. In an example, the bit line 230 may be one of the bit lines 120 and the source line 220 may be the source line 150.

The source gate 210 controls an amount of current that can flow through a NAND string 240. In an example, the NAND string 240 corresponds to the NAND string 140. The source line 220 may provide a voltage that is controlled by the source gate 210. In addition, a first gate 250 and a second gate 260 can be connected to the NAND string 240. The first gate 250 and the second gate 260 are used to select/enable the NAND string 240. For example, a gate of the first gate 250 can be connected to the select gate 160 and a gate of the second gate 260 can be connected to the select gate 170 to enable the NAND string 240.

Once enabled, the NAND string 240 can receive a voltage that is controlled by the source gate 210. Some memory operations, such as an erase operation, use a high voltage that is applied across the terminals of the NAND string 240. The high voltage can be 25 volts. The source gate 210 can connect the bit line 230 and the source line 220 to provide the high voltage across the NAND string 240. The NAND string 240 may include multiple bits, with each bit connected to its own word line such that the bits are selectable via the bit line and the word line.

As the source gate 210 includes a LV device, the voltages across the dielectric layer in the LV device are controlled such that the voltages do not exceed a low-voltage threshold. The low-voltage threshold can be 3.0V, 3.6V, 4.0V, etc. The voltage at the source and drain of the LV device are at a high voltage (e.g., 25 volts). A bias generator can provide a LV delta voltage on top of an absolute HV voltage. In addition, a HV delta can also be produced and provided to other circuits that need a HV delta voltage to be applied.

Producing both a HV delta and a LV delta is advantageous for NAND devices. For example, certain NAND operations need a HV to operate. An erase operation is one operation that needs a HV to complete. So low voltages are not enough for complete operation of a NAND device. LV biases, however, can be required for safely using a source gate with LV components. Accordingly, in various examples, both the HV and LV differentials can be used.

Figure 3:
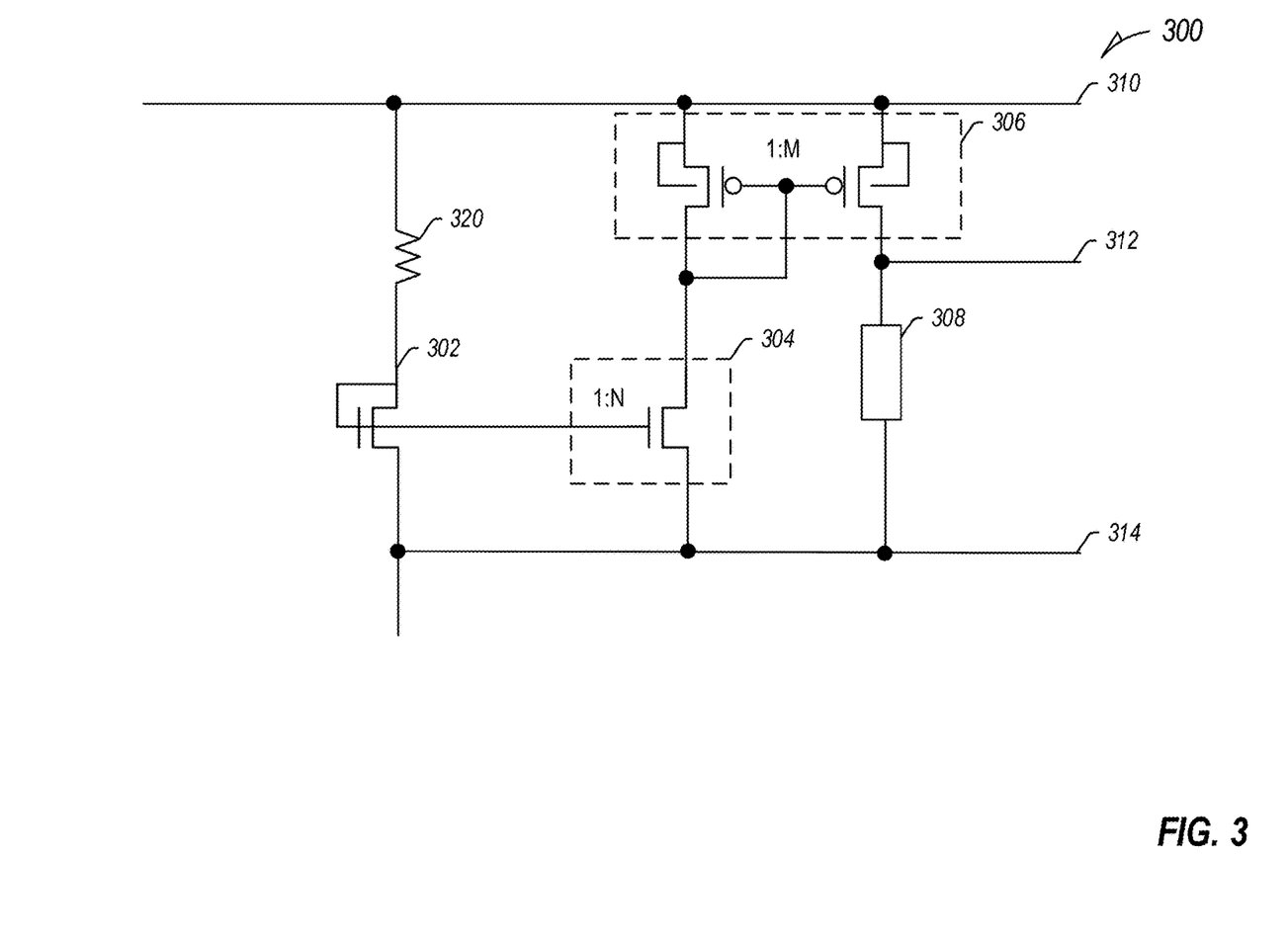
FIG. 3 illustrates an example bias generator that generates a low-voltage differential based on high-voltage supplies.

FIG. 3 illustrates an example bias generator 300 that generates a low-voltage differential based on high-voltage supplies. A high-voltage (HV) line 310 provides a high voltage based on a regulated HV line 314. A low-voltage line 312 provides a high voltage as well. The voltage differential, however, between the LV line 312 and the regulated HV line 314 can be below the low-voltage threshold. The low-voltage threshold, or differential between the LV line 312 and the regulated HV line 314 can include a logic operating voltage, whereas a high voltage can include an elevated voltage greater (in certain examples, at least 2× greater or more) than the low-voltage threshold. Accordingly, LV devices can safely operate based on the LV line 312 and the regulated HV line 314.

The bias generator 300 includes a main diode 302. The voltage between the gate and source of the main diode 302 influences the voltage provided on the HV line 310. In an example, the gate/source voltage, $$V_{gs}, \text{ is } V_{gs} = V_{th} + \sqrt{\frac{2I}{u_N * C_{ox} * \frac{W}{L}}},$$

where $V_{th}$ is a threshold voltage, $u_N$ is the electron mobility, I is the current, $C_{ox}$ is the oxide capacitance per unit of length, and W/L is the width/length of the main diode 302. In an example, the voltage provided at the HV line 310 is the voltage at the regulated HV line 314+$V_{gs}$+IR, where R is the resistance of resistor 320. The resistor 320 can be used to increase corner robustness of the HV delta. The main diode 302 can be changed to provide a low voltage differential; however, in such a configuration a high voltage differential may not be provided. This configuration, therefore, would not be as useful in a NAND device.

As the voltage differential between the LV line 312 and the regulated HV line 314 remains under the low-voltage threshold, a first current mirror 304, a second current mirror 306, and an impedance 308 can be used to control the voltage of the LV line 312. In an example, the voltage at the LV line 312 is given by the voltage at the HV regulated line+Z*I, where Z is the resistance of the impedance 308. Based on this, the voltage can be controlled based on the impedance 308.

The first current mirror 304 may include N devices and the second current mirror 306 may include M devices. The current flowing through the impedance 308, therefore, may be controlled based on the first current mirror 304 and the second current mirror 306. Generally, the current flowing through the impedance 308 can be calculated as N*M*I, where I is the current flowing through the current mirrors. In an example, both the first current mirror 304 and the second current mirror 306 include a single device, such that the current flowing through the impedance 308 is I, that is where N and M is 1. The second current mirror 306 may include HV devices or LV devices. When the second current mirror 306 includes LV devices, additional circuitry may be added to provide additional protection regarding applying low voltages across the dielectric layers of the LV devices in the second current mirror 306. This additional circuitry is described in greater detail in regard to FIG. 4.

Figure 4:
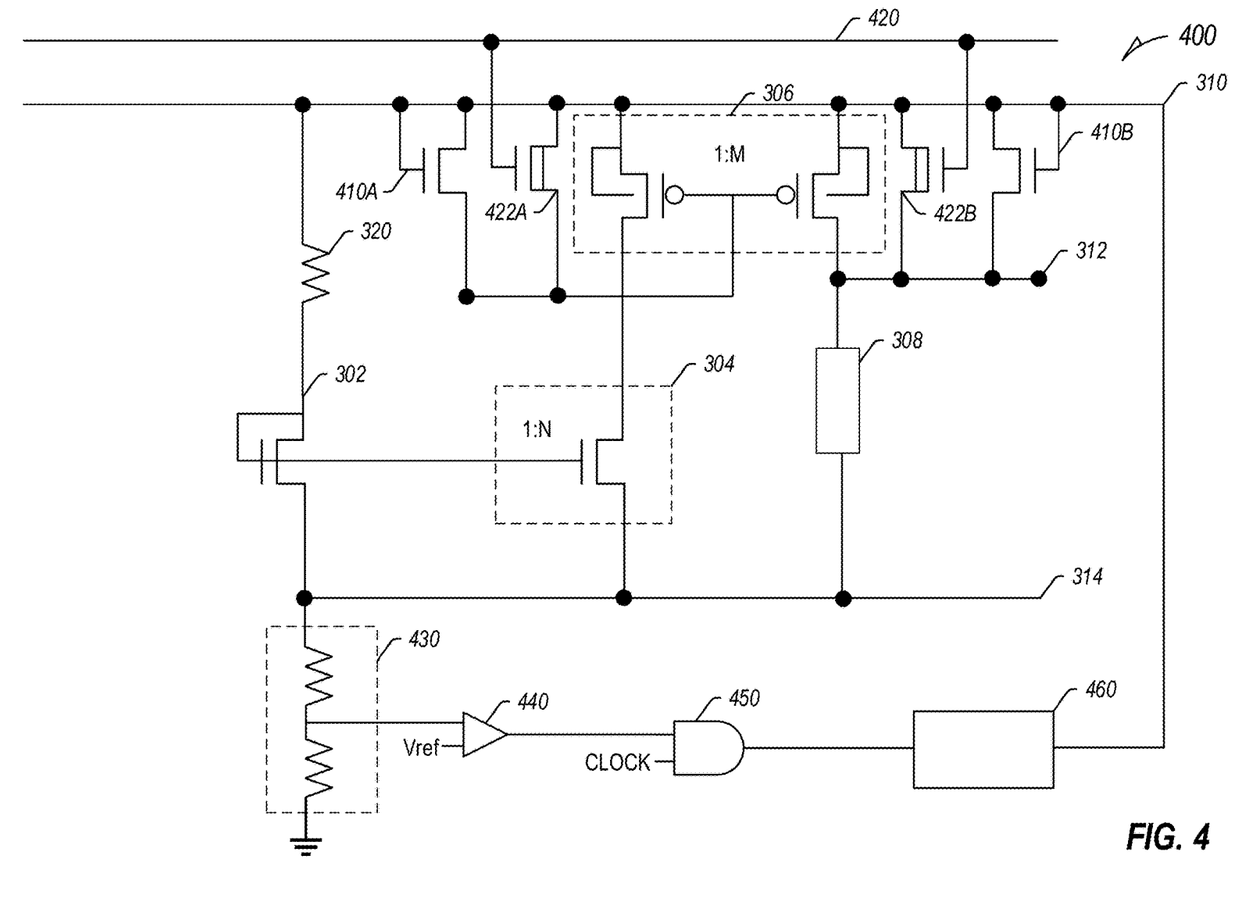
FIG. 4 illustrates an example bias generator that generates a low-voltage differential based on high-voltage supplies with additional protection circuitry.

FIG. 4 illustrates an example bias generator 400 that generates a low-voltage differential based on high-voltage supplies with additional protection circuitry. The bias generator 400 includes the same circuitry as the bias generator 300 from FIG. 3. In some examples, the bias generator 400 includes devices 422A and 422B that are used to deplete charge across the source and drain of LV devices in the second current mirror 306. The devices 422A and 422B are not used to generate the low voltage across the LV line 312 and the regulated HV line 314. Rather, the devices 422A and 422B provide additional protection for safe operation of LV devices. In an example, the devices 422A and 422B are always on and are used to short, via a short line 420, the source and drain of devices within the second current mirror 306. For example, the second current mirror 306 may include LV devices, such as PMOS devices. The devices 422A and 422B can be used to short the source and drain of the PMOS devices when a corresponding device, such as the source gate, is not in use. Shorting the source and drain ensures that there is a low-voltage below the low-voltage threshold across the various LV devices; thus, devices 422A and 422B can be used to ensure safe usage of LV devices.

Devices 410A and 410B also do not contribute to generating the low-voltage differential. While devices 422A and 422B provide protection when a connected device, such as the source gate, is disabled, the devices 410A and 410B provide additional protection when the connected device is enabled. The devices 410A and 410B can regulate current and voltage to avoid stressful conditions on devices within the second current mirror 306. For example, the second current mirror 306 can include low-voltage devices. In these examples, the devices 410A and 410B can regulate voltage to ensure safe operation of the LV devices.

Other portions of the bias generator 400 are shown for completeness. A resistive ladder 430 that provides a gain connects to the main diode 302, ground, and a comparator 440. The comparator 440 is coupled to the voltage from the resistive ladder 430 and the $V_{ref}$ voltage. The result of the comparator 440 is provided to an AND gate 450. The AND gate 450 provides a signal that is used to enable a charge pump 460 based on the voltage from the comparator 440 and a clock. When the output from the comparator is high, the AND gate 450 provides the clock to the charge pump 460 that enables the charge pump 460. When the clock is not provided to the charge pump 460, the charge pump 460 is disabled. The charge pump 460 can provide the voltage on the HV line 310.

In an example, only the current that flows through the resistive ladder goes to ground. As current generated by HV charge pumps are expensive in terms of currents requested from the NAND external supply pin (e.g., icc). The bias generator injects the current used to generate the LV differential into the HV regulated line. This current, therefore, contributes to the charge of a connected load (e.g., NAND string) instead of the current being wasted to ground. The current flowing through the main diode 302 is equal to the resistive ladder current and the current through the regulated HV line 314 (e.g., the high-voltage load current). The current flowing through the impedance 308, therefore, is proportional to the high-voltage load current. This creates a self-tracking property where the low-voltage differential between the LV line 312 and the HV line 310 is larger when large capacitive loads need to be driven. The self-tracking property allows a dynamic-overdrive based on a desired erase ramp speed and capacitive load. In addition, the charge up within the low-voltage threshold limits of the gate/source and gate/drain terminals is sped up based on the self-tracking property of the bias generator. This self-tracking property is illustrated in FIG. 6 and FIG. 7.

Figure 5:
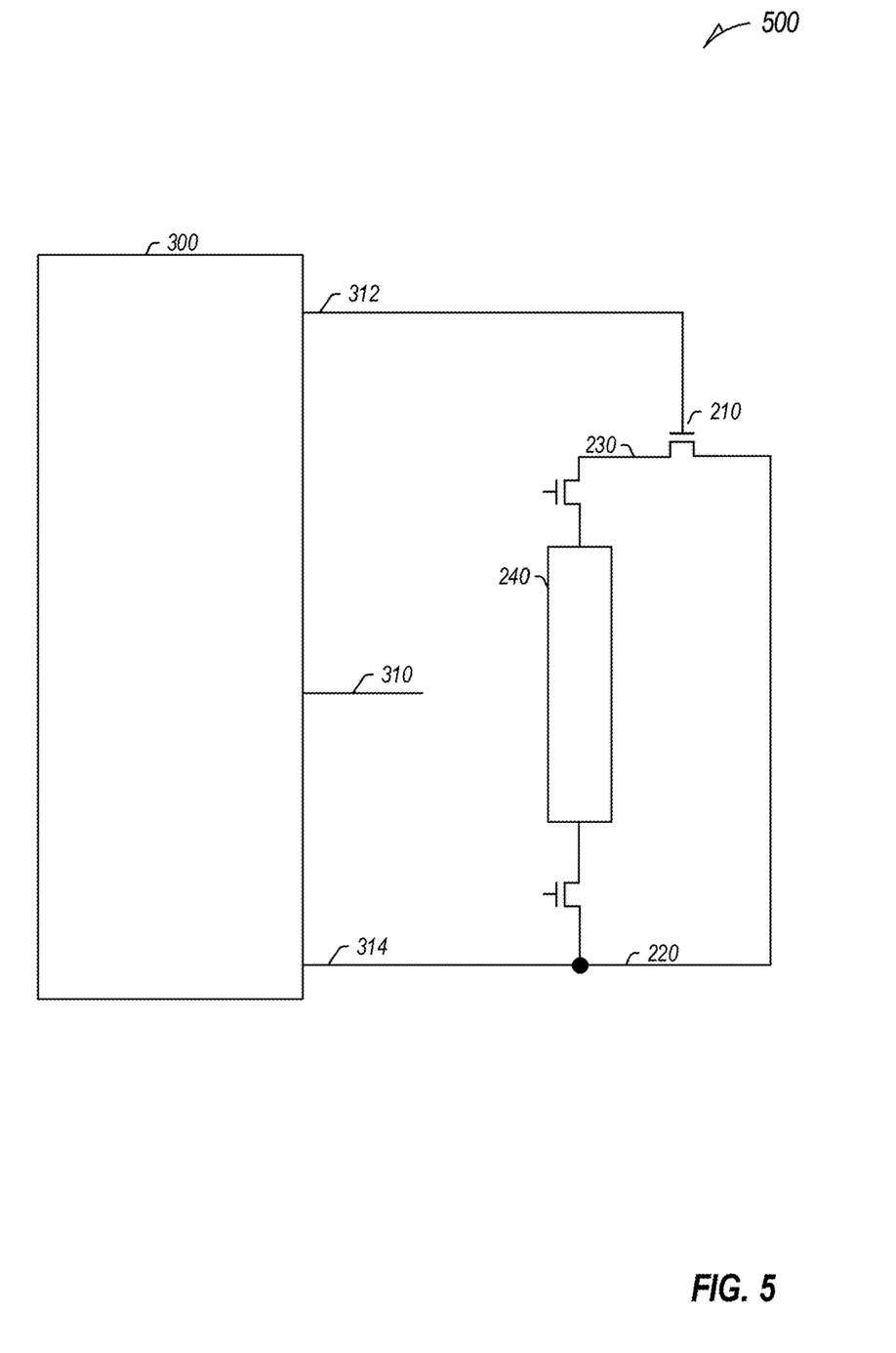
FIG. 5 illustrates an example bias generator connected to a low-voltage source gate.

FIG. 5 illustrates an example configuration 500 of a bias generator 300 connected to a low-voltage source gate 210. The bias generator 300 connects its LV line 312 to a gate of the source gate 210 of a NAND cell, and the regulated HV line 314 to the source line 220 of the NAND cell. The bias generator 300 ensures that the voltage differential between the LV line 312 and the regulated HV line 314 is less than the LV threshold. Accordingly, the source gate 210 can include a LV device. The source gate 210 can connect the source line 220 to the bit line 230 such that a high voltage can be applied across the NAND string 240. For example, the high voltage can be used to erase the contents of the NAND string 240.

Figure 6:
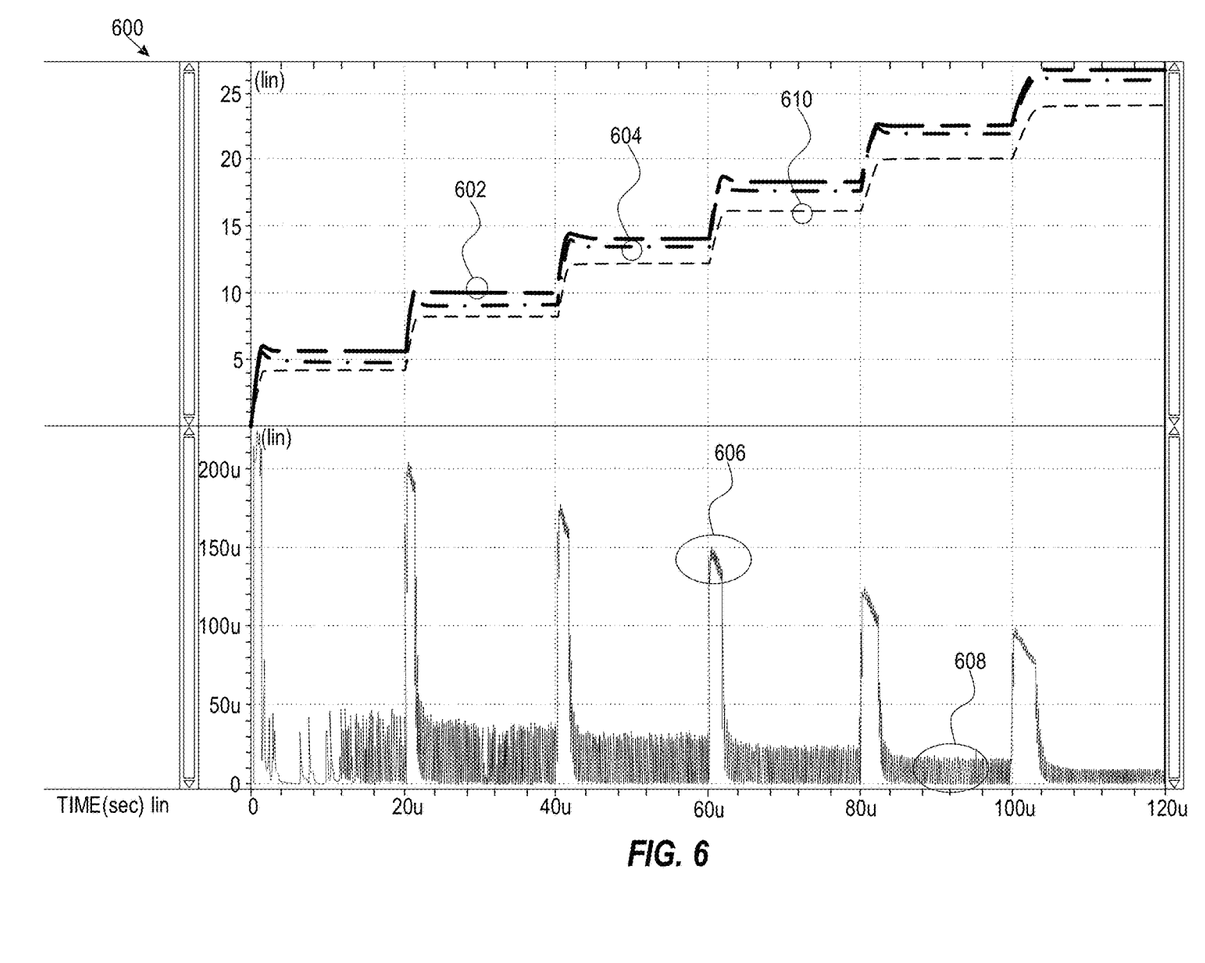
FIG. 6 illustrates a graph of currents and voltages of the bias generator.
Figure 7:
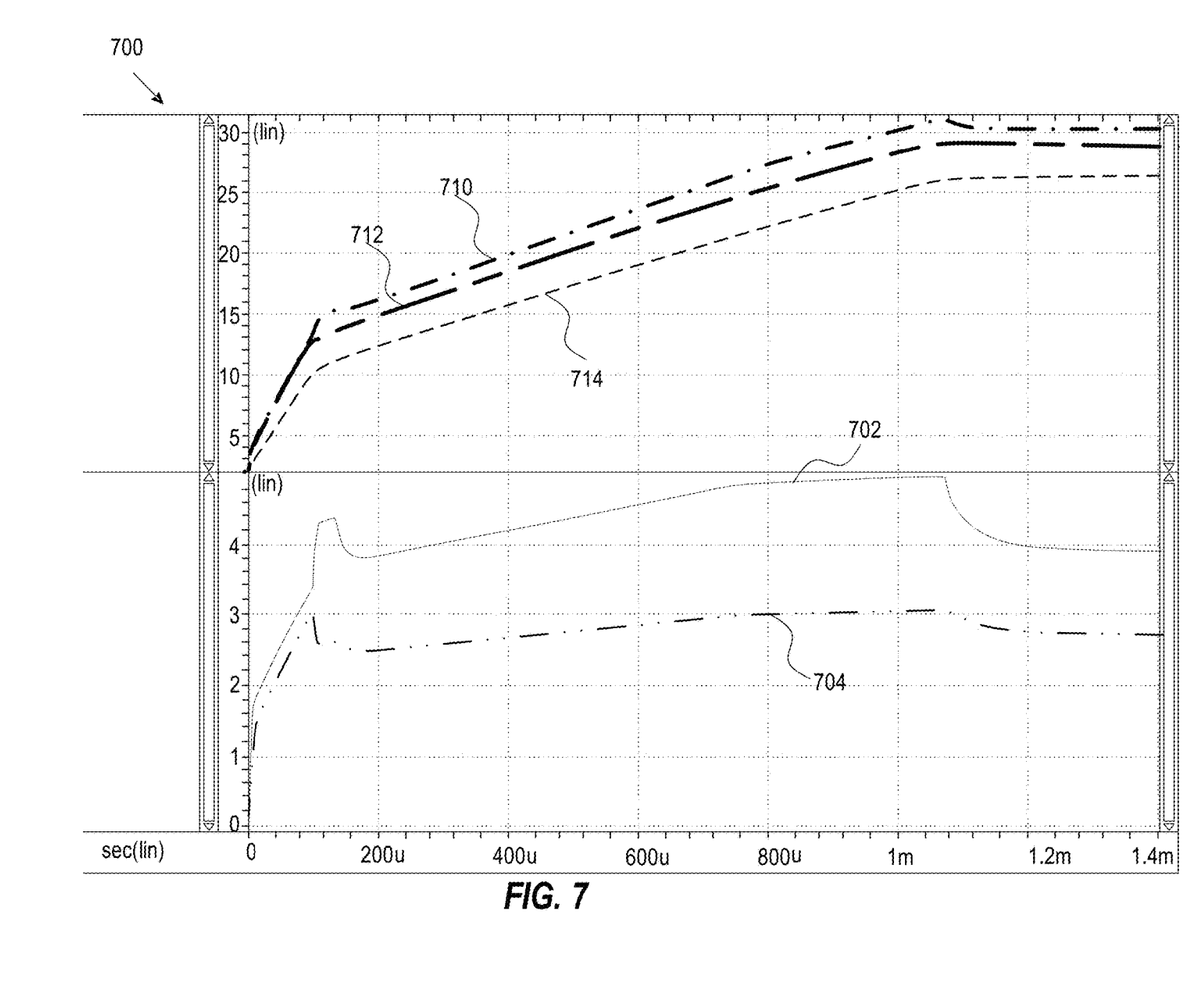
FIG. 7 illustrates a graph of voltages and voltage differentials of the bias generator.

FIG. 6 illustrates a graph 600 of currents and voltages of the bias generator. A voltage 610 of the high voltage regulated line is plotted across time and shows the voltage steps of the enabled charge pump. The voltages 602 and 604 illustrate the voltage of the low-voltage line based on two different examples. The voltage 602 shows the voltage where the bias generator uses HV diodes. The voltage 604 shows the voltage where the bias generator uses LV diodes. Regardless of the diodes used, the voltage differential between the voltage 610 and voltages 602 and 604 is below the low-voltage threshold (e.g., 4 volts).

The lower half of the graph 600 illustrates current through the current mirror 306, which in part corresponds to the current through the impedance (e.g., the impedance 308) of the bias generator and in part corresponds to the current delivered to the HV line 312. When the charge pump is in a transient state (e.g., where the voltage in pump stages or the voltage output changes), the charge pump uses current. Area 606 illustrates one such transient transition where the voltage of the HV regulation line changes. During this time, the current through the impedance peaks. This current results in the self-tracking property where the difference in voltage between the HV regulated line and the LV line is maximized when the capacitive loads of the charge pump are driven. Area 608 shows the current through the impedance during a steady state of the charge pump (e.g., when the charge pump is not increasing in voltage).

FIG. 7 illustrates a graph 700 of voltages and voltage differentials of the bias generator. A top portion of the graph 700 shows the voltages of the HV line 710, the HV regulated line 712, and the LV line 714. The bottom portion of the graph 700 shows a voltage differential 702 between the HV line 710 and the HV regulated line 712 and a voltage differential 704 between the LV line 714 and the HV regulated line 712. The differential 702 can be above the low-voltage threshold and used to drive HV devices. The differential 704, however, is always below the low-voltage threshold (e.g., 3 volts). The differential 704, therefore, can be used to safely drive LV devices.

Figure 8:
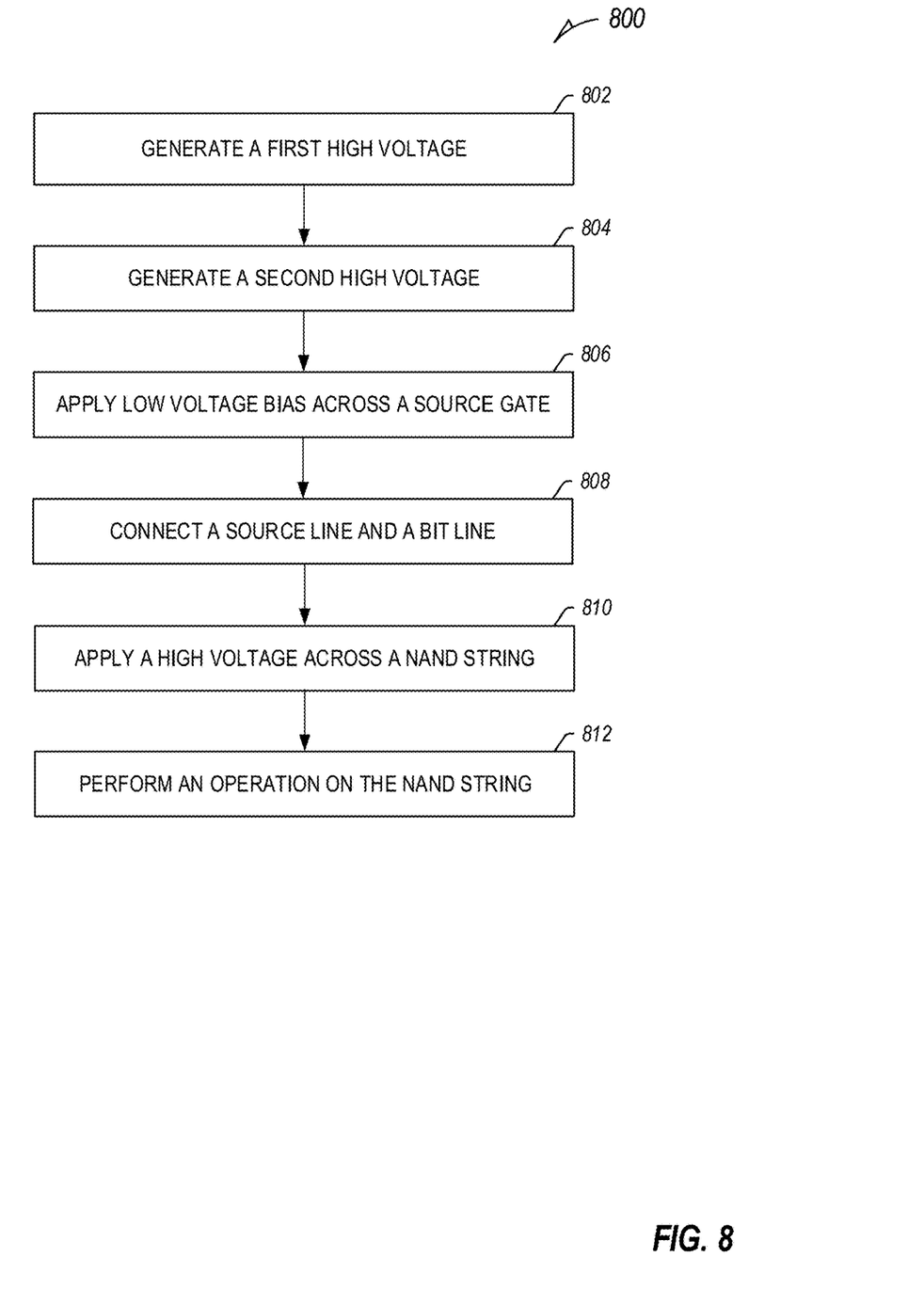
FIG. 8 illustrates an example method of performing high-voltage operations on a NAND string.

FIG. 8 illustrates an example method of performing high-voltage operations on a NAND string. At 802, a bias generator, such as the bias generator 300 in FIG. 3 or the bias generator 400 in FIG. 4, generates a first high voltage on a source line associated with a NAND string. The high voltage can be the regulated high voltage from the bias generator. For example, the high voltage regulated line can be connected to the source line. At 804, a second high voltage is generated using the bias generator. The difference between the second high voltage and the first high voltage is below a low voltage threshold. In examples, the low voltage threshold can be 4.0V, 3.6V, 3V, etc. At 806, the voltage differential based on the second high voltage and the first high voltage is applied across a source gate. The source gate is a low-voltage device, such that voltages above the low-voltage threshold applied across a dielectric layer of the LV device can damage the LV device. The voltage differential can be applied across the gate terminal and a source or drain terminal.

At 808, the source gate connects the source line and a bit line based on the applied voltage differential. The source line can be at a high voltage, such that connecting the source line and the bit line results in a high voltage being applied on the bit line as well. In an example, the high voltage is 25 volts. At 810, the high voltage is applied across a NAND string. The NAND string may be connected in between the source line and the bit line. At 812, an operation is performed on the NAND string based on the applied high voltage. In an example, the operation is an erasure operation, such that the data stored in the NAND string is erased.

The bias generator may also generate a third high voltage that can be used with the regulated high voltage to generate a high voltage differential for additional circuitry.

The bias generator may include a charge pump that generate a high voltage on a HV line. A voltage is considered high when the voltage is above a low-voltage threshold. A main diode can be connected between the HV line and a HV regulated line. A resistor can be connected between the HV line and the main diode. The resistor controls the voltage on the HV line. A first current mirror is connected to the HV regulated line. In addition, the gate of the main diode is connected to the gate of the first current mirror. There can be N number of current mirrors within the first current mirror.

A second current mirror is connected to the first current mirror and to the HV line. An output of the second current mirror is connected to a low-voltage (LV) line. There can be M number of current mirrors within the second current mirror. The number of current mirrors in the first and the second current mirrors can be used to control the amount of voltage output on the LV line. For example, the current that flows through the impedance can be M*N*current flowing through the main diode. In addition, the current flowing through the main diode is proportional to the current flowing through the impedance.

The bias generator can also include an impedance that is connected to the LV line and the HV regulated line. A voltage differential between the HV regulated line and the LV line is below the low-voltage threshold. The voltage differential between the HV regulated line and the HV line is above the low-voltage threshold. The bias generator, therefore, can be used to provide voltage to both LV devices and to HV devices. The voltage on the LV line is based on the impedance.

In examples, the second current mirror can include HV devices. In other examples, the second current mirror can include LV devices such as p-type metal-oxide-semiconductor (PMOS) devices. When LV devices are used, the bias generator can include additional circuitry to provide LV safeguards. In other examples, this additional circuitry is not used or needed. The additional circuitry can include a first transistor that is connected to the HV line and to an input of the second current mirror. A second transistor is connected to the HV line and the LV line. The first transistor and the second transistor regulate conditions on the LV PMOS devices. For example, these transistors ensure that the voltages applied across the dielectric layers on the PMOS devices are below the low-voltage threshold while the bias generator is operating.

When the second current mirror includes LV devices, additional circuitry can be included to protect the LV devices when the connected device is disabled. For example, a first transistor can be connected to a shorted line and the input of the second current mirror. A second transistor can be connected to the shorted line and the LV line. The first and second transistors can short the source and drain of the LV devices in the second current mirror when the connected device is disabled. Shorting the source and the drain ensures that any voltage across the source, drain, and gate is less than the low-voltage threshold.

Figure 9:
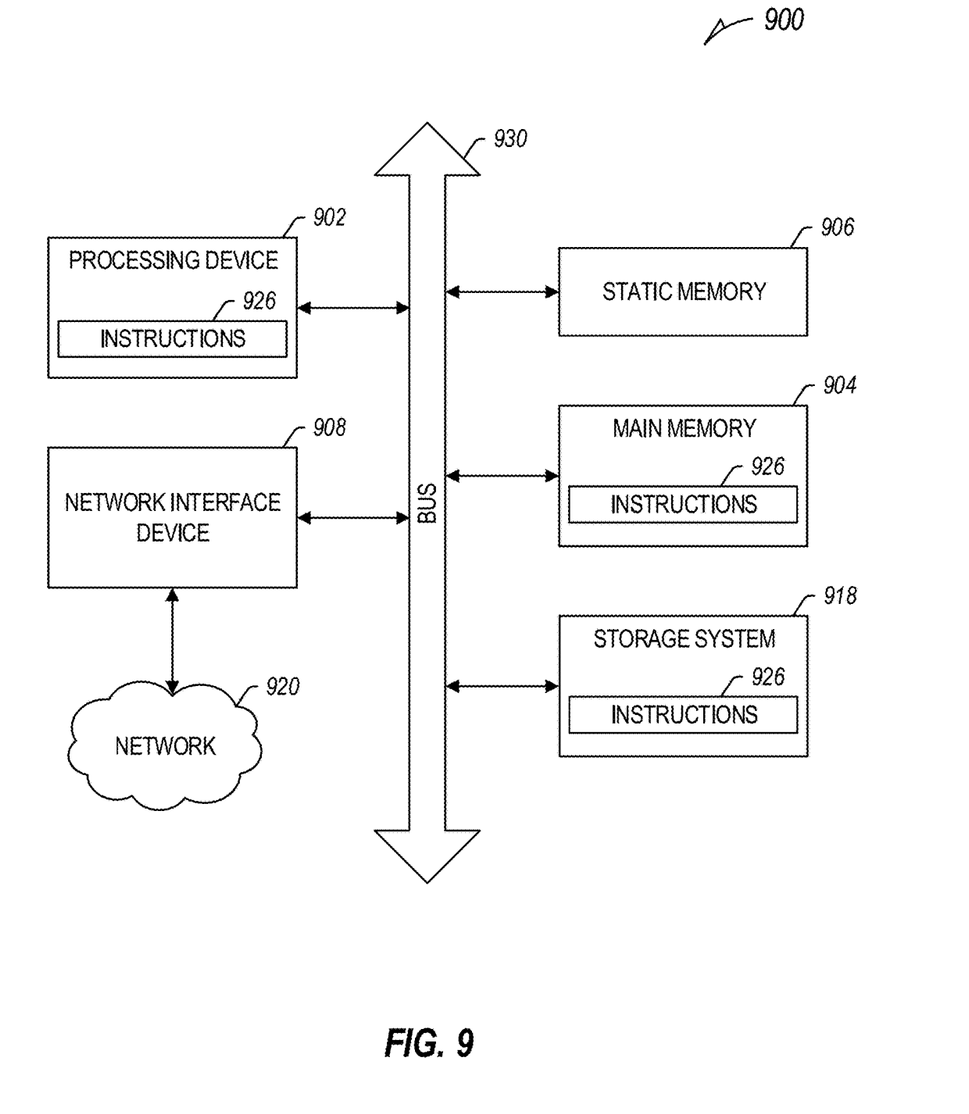
FIG. 9 illustrates an example computer system within which a set of instructions may be executed for causing the machine to perform any one or more of the methodologies discussed herein, according to implementations of the present disclosure.

FIG. 9 illustrates a block diagram of an example machine (e.g., a host system) 900 upon which any one or more of the techniques (e.g., methodologies) discussed herein may perform. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 900 may include a processing device 902 (e.g., a hardware processor, a central processing unit (CPU), a graphics processing unit (GPU), a hardware processor core, or any combination thereof, etc.), a main memory 904 (e.g., read-only memory (ROM), dynamic random-access memory (DRAM) such as synchronous DRAM (SDRAM) or Rambus DRAM (RDRAM), etc.), a static memory 906 (e.g., static random-access memory (SRAM), etc.), and a storage system 918, some or all of which may communicate with each other via a communication interface (e.g., a bus) 930.

The processing device 902 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 902 can also be one or more special-purpose processing devices such as an application specific integrated circuit (ASIC), a field programmable gate array (FPGA), a digital signal processor (DSP), network processor, or the like. The processing device 902 can be configured to execute instructions 926 for performing the operations and steps discussed herein. The computer system 900 can further include a network interface device 908 to communicate over a network 920.

The storage system 918 can include a machine-readable storage medium (also known as a computer-readable medium) on which is stored one or more sets of instructions 926 or software embodying any one or more of the methodologies or functions described herein. The instructions 926 can also reside, completely or at least partially, within the main memory 904 or within the processing device 902 during execution thereof by the computer system 900, the main memory 904 and the processing device 902 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 900 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 900 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 926 (e.g., software, programs, an operating system (OS), etc.) or other data are stored on the storage system 918 can be accessed by the main memory 904 for use by the processing device 902. The main memory 904 (e.g., DRAM) is typically fast, but volatile, and thus a different type of storage than the storage system 918 (e.g., an SSD), which is suitable for long-term storage, including while in an "off" condition. The instructions 926 or data in use by a user or the machine 900 are typically loaded in the main memory 904 for use by the processing device 902. When the main memory 904 is full, virtual space from the storage system 918 can be allocated to supplement the main memory 904; however, because the storage system 918 device is typically slower than the main memory 904, and write speeds are typically at least twice as slow as read speeds, use of virtual memory can greatly reduce user experience due to storage system latency (in contrast to the main memory 904 (e.g., DRAM). Further, use of the storage system 918 for virtual memory can greatly reduce the usable lifespan of the storage system 918.

The instructions 924 may further be transmitted or received over a network 920 using a transmission medium via the network interface device 908 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 908 may include one or more physical jacks (e.g., Ethernet, coaxial, or phone jacks) or one or more antennas to connect to the network 920. In an example, the network interface device 908 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 900, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

Example 1 is an apparatus comprising: a main diode having first and second terminals, the first terminal coupled to a high voltage (HV) line and the second terminal coupled to an HV regulated line, wherein the main diode is configured to provide a voltage on the HV regulated line lower than a voltage of the HV line; a first current mirror configured to provide a first current, the first current mirror having a gate and first and second terminals, the gate coupled to the first terminal of the main diode and the second terminal coupled to the HV regulated line; a second current mirror configured to provide a second current, the second current mirror having first, second, and third terminals, the first terminal coupled to the HV line, the second terminal coupled to the first terminal of the first current mirror, and the third terminal coupled to a low-voltage (LV) line; an impedance coupled between the LV line and the HV regulated line, wherein the impedance, currents of the first and second current mirrors, and the main diode are configured to provide a voltage differential between the HV regulated line and the LV line below a low-voltage threshold, to provide a voltage differential between the HV regulated line and the HV line above the low-voltage threshold, and wherein a voltage on the LV line depends on the impedance.

In Example 2, the subject matter of Example 1 includes, wherein the second current mirror comprises LV p-type metal-oxide-semiconductor (PMOS) devices.

In Example 3, the subject matter of Example 2 includes, a first transistor connected to the HV line and an input of the second current mirror; and a second transistor connect to the HV line and the LV line, wherein the first transistor and the second transistor regulate conditions on the LV PMOS devices.

In Example 4, the subject matter of Examples 2-3 includes, a shorted line; a first transistor connected to the shorted line and an input of the second current mirror; and a second transistor connected to the shorted line and the LV line, wherein the shorted line shorts a source and drain of the LV PMOS devices when the device is disabled.

In Example 5, the subject matter of Examples 1-4 includes, wherein the second current mirror comprises HV devices.

In Example 6, the subject matter of Examples 1-5 includes, wherein the low-voltage threshold is 4 volts.

In Example 7, the subject matter of Examples 1-6 includes, wherein the voltage differential between the HV regulated line and the HV line is 25 volts or less.

In Example 8, the subject matter of Example 7 includes, wherein the voltage differential between the HV regulated line and the LV line is 3.6 volts.

In Example 9, the subject matter of Examples 1-8 includes, wherein a current flowing through the HV line is proportional to a current following through the impedance.

In Example 10, the subject matter of Examples 1-9 includes, wherein the first current mirror comprises N devices.

In Example 11, the subject matter of Example 10 includes, wherein the second current mirror comprises M devices.

In Example 12, the subject matter of Example 11 includes, wherein a current flowing in the impedance is based on N and M.

Example 13 is a method comprising: receiving a high voltage (HV) from an HV line and providing a voltage on an HV regulated line lower than a voltage of the HV line using a main diode; providing a first current using a first current mirror, the first current mirror having a gate and first and second terminals, the gate coupled to the first terminal of the main diode and the second terminal coupled to the HV regulated line; providing a second current using a second current mirror, the second current mirror having first, second, and third terminals, the first terminal coupled to the HV line, the second terminal coupled to the first terminal of the first current mirror, and the third terminal coupled to a low-voltage (LV) line; providing a voltage differential between the HV regulated line and the LV line below an LV threshold using the impedance, currents of the first and second current mirrors, and the main diode; and providing a voltage differential between the HV regulated line and the HV line above the LV threshold.

In Example 14, the subject matter of Example 13 includes, wherein the second current mirror comprises LV p-type metal-oxide-semiconductor (PMOS) devices.

In Example 15, the subject matter of Examples 13-14 includes, wherein the second current mirror comprises HV devices.

Example 16 is a system for storing data, the system comprising: a main diode having first and second terminals, the first terminal coupled to a high voltage (HV) line and the second terminal coupled to an HV regulated line, wherein the main diode is configured to provide a voltage on the HV regulated line lower than a voltage of the HV line; a first current mirror configured to provide a first current, the first current mirror having a gate and first and second terminals, the gate coupled to the first terminal of the main diode and the second terminal coupled to the HV regulated line; a second current mirror configured to provide a second current, the second current mirror having first, second, and third terminals, the first terminal coupled to the HV line, the second terminal coupled to the first terminal of the first current mirror, and the third terminal coupled to a low-voltage (LV) line; an impedance coupled between the LV line and the HV regulated line, wherein the impedance, currents of the first and second current mirrors, and the main diode are configured to provide a voltage differential between the HV regulated line and the LV line below a low-voltage threshold, to provide a voltage differential between the HV regulated line and the HV line above the low-voltage threshold, and wherein a voltage on the LV line depends on the impedance; a source gate connected to a bit line, a source line and the LV line, the bit line connected to a NAND stack; the NAND stack to store data; and the source line connected to the HV regulated line and the NAND stack.

In Example 17, the subject matter of Example 16 includes, wherein the source gate connects the bit line and the source line based on a voltage differential between the LV line and the HV regulated line.

In Example 18, the subject matter of Example 17 includes, wherein a high voltage is applied to the NAND stack when the bit line and the source line are connected.

In Example 19, the subject matter of Example 18 includes, wherein the data is erased based on the applied high voltage.

In Example 20, the subject matter of Examples 16-19 includes, wherein the second current mirror comprises LV p-type metal-oxide-semiconductor (PMOS) devices, and the system further comprises: a first transistor connected to the HV line and an input of the second current mirror; and a second transistor connect to the HV line and the LV line, wherein the first transistor and the second transistor regulate conditions on the LV PMOS devices.

Example 21 is a method for performing an operation on a NAND string, the method comprising: generating, using a bias generator, a first high voltage on a source line; generating, using the bias generator, a second high voltage on a high voltage (HV) line, wherein a differential between the second high voltage and the first high voltage is below a low voltage (LV) threshold; applying a voltage differential across a source gate based on the first high voltage and the second high voltage, wherein the source gate is a low voltage device; connecting, using the source gate, the source line and a bit line based on the voltage differential across the source gate; applying a high voltage differential to a NAND string based on connecting the source line and the bit line; and performing an operation on the NAND string based on the applied high voltage.

In Example 22, the subject matter of Example 21 includes, wherein performing an operation comprises erasing data in the NAND string.

In Example 23, the subject matter of Examples 21-22 includes, generating, using the bias generator, a third high voltage on a third HV line, wherein the differential between the first high voltage and the third high voltage is above the LV threshold.

Example 24 is at least one machine-readable medium including instructions that, when executed by processing circuitry, cause the processing circuitry to perform operations to implement of any of Examples 1-23.

Example 25 is an apparatus comprising means to implement of any of Examples 1-23.

Example 26 is a system to implement of any of Examples 1-23.

Example 27 is a method to implement of any of Examples 1-23.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A bias generator, comprising:
   a main diode having first and second terminals, the first terminal coupled to a high-voltage (HV) line and the second terminal coupled to an HV regulated line, wherein the main diode is configured to provide a voltage on the HV regulated line lower than a voltage of the HV line;
   a first current mirror configured to provide a first current, the first current mirror having a gate and first and second terminals, the gate coupled to the first terminal of the main diode and the second terminal coupled to the HV regulated line;
   a second current mirror configured to provide a second current, the second current mirror having first, second, and third terminals, the first terminal coupled to the HV line, the second terminal coupled to the first terminal of the first current mirror, and the third terminal coupled to a low-voltage (LV) line;
   an impedance coupled between the LV line and the HV regulated line,
   wherein the impedance, currents of the first and second current mirrors, and the main diode are configured to provide a voltage differential between the HV regulated line and the LV line below a low-voltage threshold, to provide a voltage differential between the HV regulated line and the HV line above the low-voltage threshold, and wherein a voltage on the LV line depends on the impedance.

2. The device of claim 1, wherein the second current mirror comprises LV p-type metal-oxide-semiconductor (PMOS) devices.

3. The device of claim 2, further comprising:
   a first transistor connected to the HV line and an input of the second current mirror; and
   a second transistor connect to the HV line and the LV line, wherein the first transistor and the second transistor regulate conditions on the LV PMOS devices.

4. The device of claim 2, further comprising:
a shorted line;
a first transistor connected to the shorted line and an input of the second current mirror; and
a second transistor connected to the shorted line and the LV line, wherein the shorted line shorts a source and drain of the LV PMOS devices when the device is disabled.

5. The device of claim 1, wherein the second current mirror comprises HV devices.

6. The device of claim 1, wherein the low-voltage threshold is 4 volts.

7. The device of claim 1, wherein the voltage differential between the HV regulated line and the HV line is 25 volts or less.

8. The device of claim 7, wherein the voltage differential between the HV regulated line and the LV line is 3.6 volts.

9. The device of claim 1, wherein a current flowing through the HV line is proportional to a current following through the impedance.

10. The device of claim 1, wherein the first current mirror comprises N devices.

11. The device of claim 10, wherein the second current mirror comprises M devices.

12. The device of claim 11, wherein a current flowing in the impedance is based on N and M.

13. A method comprising:
receiving a high voltage (HV) from an HV line and providing a voltage on an HV regulated line lower than a voltage of the HV line using a main diode;
providing a first current using a first current mirror, the first current mirror having a gate and first and second terminals, the gate coupled to the first terminal of the main diode and the second terminal coupled to the HV regulated line;
providing a second current using a second current mirror, the second current mirror having first, second, and third terminals, the first terminal coupled to the HV line, the second terminal coupled to the first terminal of the first current mirror, and the third terminal coupled to a low-voltage (LV) line;
providing a voltage differential between the HV regulated line and the LV line below an LV threshold using the impedance, currents of the first and second current mirrors, and the main diode; and
providing a voltage differential between the HV regulated line and the HV line above the LV threshold.

14. The method of claim 13, wherein the second current mirror comprises LV p-type metal-oxide-semiconductor (PMOS) devices.

15. The method of claim 13, wherein the second current mirror comprises HV devices.

16. A system for storing data, the system comprising:
a main diode having first and second terminals, the first terminal coupled to a high-voltage (HV) line and the second terminal coupled to an HV regulated line, wherein the main diode is configured to provide a voltage on the HV regulated line lower than a voltage of the HV line;
a first current mirror configured to provide a first current, the first current mirror having a gate and first and second terminals, the gate coupled to the first terminal of the main diode and the second terminal coupled to the HV regulated line;
a second current mirror configured to provide a second current, the second current mirror having first, second, and third terminals, the first terminal coupled to the HV line, the second terminal coupled to the first terminal of the first current mirror, and the third terminal coupled to a low-voltage (LV) line;
an impedance coupled between the LV line and the HV regulated line, wherein the impedance, currents of the first and second current mirrors, and the main diode are configured to provide a voltage differential between the HV regulated line and the LV line below a low-voltage threshold, to provide a voltage differential between the HV regulated line and the HV line above the low-voltage threshold, and wherein a voltage on the LV line depends on the impedance;
a source gate connected to a bit line, a source line and the LV line, the bit line connected to a NAND stack;
the NAND stack to store data; and
the source line connected to the HV regulated line and the NAND stack.

17. The system of claim 16, wherein the source gate connects the bit line and the source line based on a voltage differential between the LV line and the HV regulated line.

18. The system of claim 17, wherein a high voltage is applied to the NAND stack when the bit line and the source line are connected.

19. The system of claim 18, wherein the data is erased based on the applied high voltage.

20. The system of claim 16, wherein the second current mirror comprises LV p-type metal-oxide-semiconductor (PMOS) devices, and the system further comprises:
a first transistor connected to the HV line and an input of the second current mirror; and
a second transistor connect to the HV line and the LV line, wherein the first transistor and the second transistor regulate conditions on the LV PMOS devices.

* * * * *